United States Patent
Manabe et al.

(10) Patent No.: US 8,580,483 B2
(45) Date of Patent: Nov. 12, 2013

(54) METHOD OF MAKING NOZZLE CHIP

(71) Applicant: Canon Kabushiki Kaisha, Tokyo (JP)

(72) Inventors: Takanobu Manabe, Kawasaki (JP);
Toshiaki Kurosu, Kawasaki (JP);
Makoto Watanabe, Yokohama (JP);
Kenji Fujii, Yokohama (JP); Yoshinori Tagawa, Yokohama (JP); Kazuhiro Asai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/708,415

(22) Filed: Dec. 7, 2012

(65) Prior Publication Data
US 2013/0149648 A1 Jun. 13, 2013

(30) Foreign Application Priority Data
Dec. 13, 2011 (WO) .................. PCT/JP2011/078748

(51) Int. Cl.
*B41J 2/16* (2006.01)
*G03F 7/20* (2006.01)

(52) U.S. Cl.
USPC .......................................... 430/320; 430/396

(58) Field of Classification Search
None
See application file for complete search history.

(56) References Cited

U.S. PATENT DOCUMENTS 6,218,081 B1 * 4/2001 Nishiwaki ...................... 430/320
2008/0150997 A1 * 6/2008 Pulver et al. ................... 347/20

FOREIGN PATENT DOCUMENTS

| JP | 8-127125 A | | 5/1996 |
| JP | 10-291318 A | * | 11/1998 |
| JP | 11-179576 A | | 7/1999 |
| JP | 2002-205406 A | | 7/2002 |
| JP | 2003-025565 A | | 1/2003 |
| JP | 2003-145769 A | | 5/2003 |
| JP | 2009-061775 A | | 3/2009 |
| JP | 2009-166492 A | | 7/2009 |
| JP | 2009-190054 A | | 8/2009 |

OTHER PUBLICATIONS

Computer-generated translation of JP 10-291318 (Nov. 1998).*

* cited by examiner

*Primary Examiner* — John A. McPherson
(74) *Attorney, Agent, or Firm* — Canon USA Inc IP Division

(57) ABSTRACT

The present disclosure provides a method of making a nozzle chip including a step of forming an ejection orifice row by performing irradiation with light rays using a mask having ejection orifice row patterns that form an ejection orifice row pattern of one nozzle chip when the ejection orifice row patterns are connected to each other through a connection portion. The mask is configured such that, with respect to a direction in which ejection orifices of the ejection orifice row are arranged, an absolute value of off-axis telecentricity of one of the light rays with which an ejection orifice that is at the smallest distance from the connection portion is irradiated is less than an absolute value of off-axis telecentricity of one of the light rays with which an ejection orifice that is at the greatest distance from the connection portion is irradiated.

3 Claims, 13 Drawing Sheets

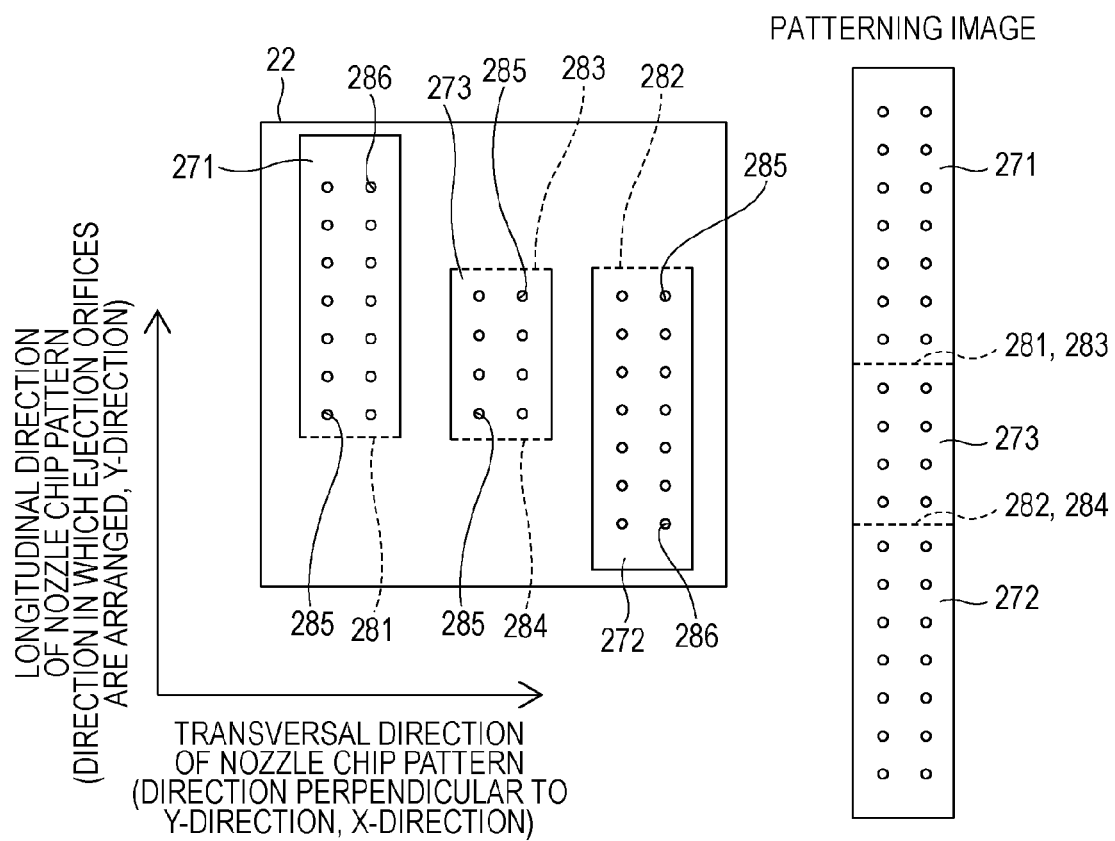

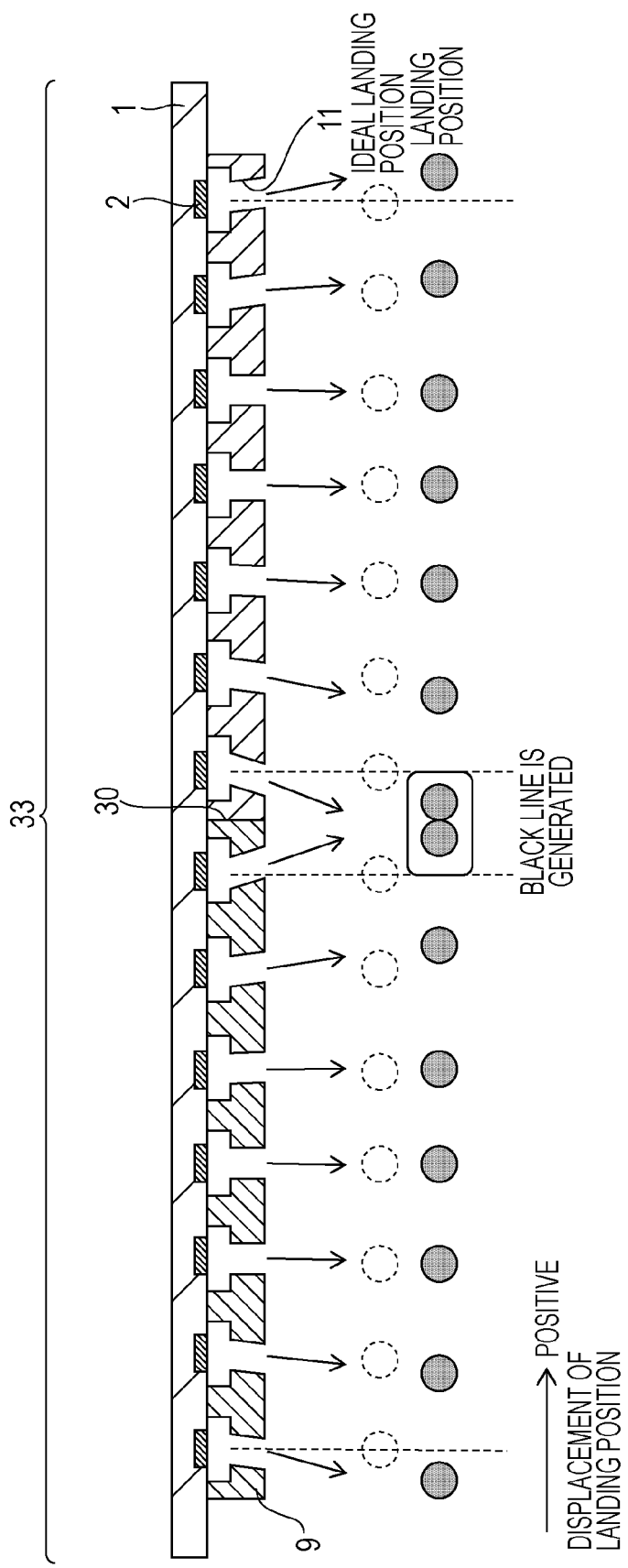

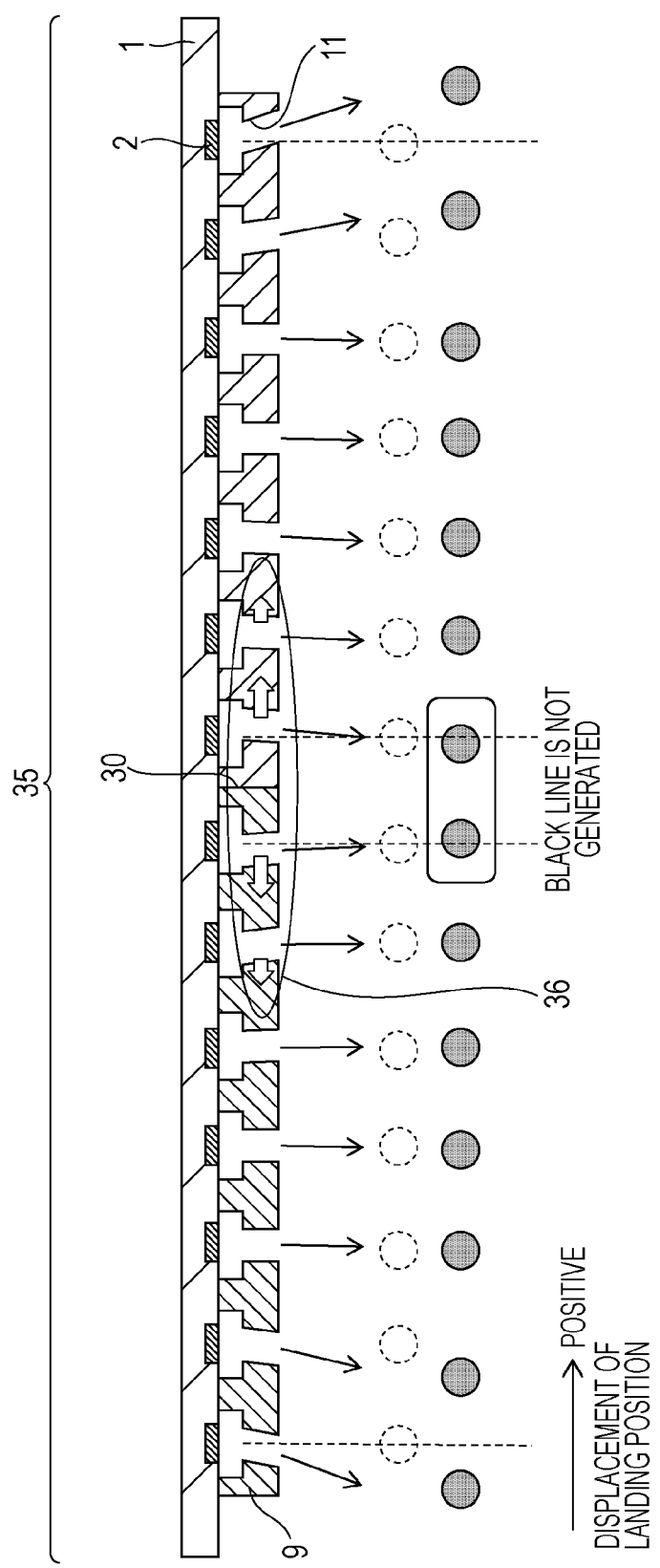

METHOD OF MAKING NOZZLE CHIP

TECHNICAL FIELD

The present disclosure relates to a method of making a nozzle chip.

BACKGROUND ART

A nozzle chip is used, for example, in a liquid ejection head that ejects a liquid from ejection orifices. Examples of a liquid ejection head include an ink jet recording head that performs recording by ejecting an ink toward a recording medium such as a sheet of paper. PTL 1 describes a method of making a nozzle chip of an ink jet recording head.

The method of making a nozzle chip described in PTL 1 will be briefly described. First, an element substrate, which includes energy generating elements that generate energy used to eject a liquid from ejection orifices, is prepared. Next, a positive photosensitive resin layer including an optical absorption agent is formed on the element substrate. Then, the positive photosensitive resin layer is exposed to light, and thereby a pattern having the shapes of flow paths is formed. Next, a negative photosensitive resin layer, which serves as an ejection orifice forming member, is formed so as to cover the pattern, and the negative photosensitive resin layer is exposed to i-line light (wavelength 365 nm), and thereby an ejection orifice row is formed. Lastly, the pattern is removed, and thereby liquid flow paths are formed.

When forming an ejection orifice row on a nozzle chip by using the method described in PTL 1, there are some cases where it is required to expose to light a pattern that is larger than a field angle size, which is the size of the largest area over which an exposure apparatus can perform exposure. In such cases, a manufacturing method called "fractionated exposure", which is described in PTL 2, may be used. With fractionated exposure, a pattern having a size larger than the field angle size is divided into portions smaller than the field angle size and arranged on a mask, and then exposure is performed. An ejection orifice row is formed by performing irradiation with light rays by using a mask having ejection orifice row patterns that form an ejection orifice row pattern of one nozzle chip when the ejection orifice patterns are connected to each other through a connection portion. A connection portion is usually a portion at which a nozzle chip is divided in a direction perpendicular to a direction in which ejection orifice rows are arranged, that is, in the longitudinal direction of the nozzle chip.

CITATION LIST

Patent Literature

PTL 1 Japanese Patent Laid-Open No. 2009-166492
PTL 2 Japanese Patent Laid-Open No. 2003-145769

However, the inventors examined the method described above and found that the landing positions of droplets ejected from ejection orifices that are located adjacent to each other with a connection portion therebetween are displaced, and thereby a line may be generated on a recording medium. Such a line may be generated when the landing positions of droplets are located adjacent to each other and dots formed by the droplets contact each other.

An object of the present invention is to provide a method of making a nozzle chip using fractionated exposure with which displacement of landing positions of droplets of a liquid ejected from ejection orifices in the vicinity of a connection portion of the fractionated exposure is reduced.

SUMMARY OF INVENTION

The present disclosure, which solves the problem described above, provides a method of making a nozzle chip including a step of forming an ejection orifice row by performing irradiation with light rays using a mask having ejection orifice row patterns that form an ejection orifice row pattern of one nozzle chip when the ejection orifice row patterns are connected to each other through a connection portion. The mask is configured such that, with respect to a direction in which ejection orifices of the ejection orifice row are arranged, an absolute value of off-axis telecentricity of one of the light rays with which an ejection orifice that is at the smallest distance from the connection portion is irradiated is less than an absolute value of off-axis telecentricity of one of the light rays with which an ejection orifice that is at the greatest distance from the connection portion is irradiated.

Further features will become apparent from the following description of exemplary embodiments with reference to the attached drawings.

BRIEF DESCRIPTION OF DRAWINGS

FIG. 6C is a schematic top view illustrating an ejection orifice row pattern of a nozzle chip on a mask.
FIG. 8A is a schematic sectional view related to ejection from a nozzle chip.
FIG. 8C is a schematic sectional view related to ejection from a nozzle chip.

DESCRIPTION OF EMBODIMENTS

The inventors examined the problem described above and found that displacement of landing positions is influenced by the structure of an optical system of an exposure apparatus and the positions of nozzle chip region patterns that are disposed on a mask so as to perform patterning of nozzle chip regions. Hereinafter, this point will be described in detail.

Figure 2:
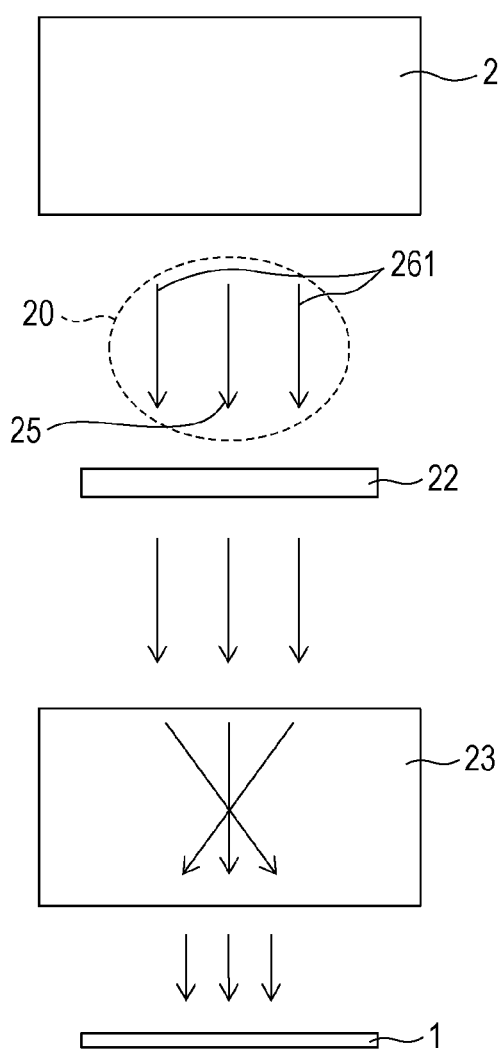
FIG. 2 is a schematic sectional view illustrating an exposure process using a reduction projection method.

FIG. 2 illustrates an exposure process performed by using an exposure apparatus including an illumination optical system 21 and a reduction projection optical system 23. The illumination optical system 21 illuminates a mask 22 with a light beam 20 emitted from a light source. The reduction projection optical system 23 projects a pattern of the mask onto a nozzle chip 1. When the center of the light beam emitted from the illumination optical system and the center of the mask are on the same axis, a light ray that passes through an outer portion (outer peripheral portion) of the mask tends to be incident on the nozzle chip at an angle, with respect a direction perpendicular to the nozzle chip, that is slightly larger than that of a light ray that passes through the center of the mask.

Because an ejection orifice pattern on the mask for an ejection orifice that is disposed near an outer periphery of the mask is projected onto a nozzle chip at an inclination the same as that of a light ray that is incident on the pattern of the ejection orifice, the ejection orifice is formed with an inclination. As a result, a droplet ejected from the ejection orifice that has been formed with an inclination lands at a position that is displaced from an ideal landing position.

Figure 1:
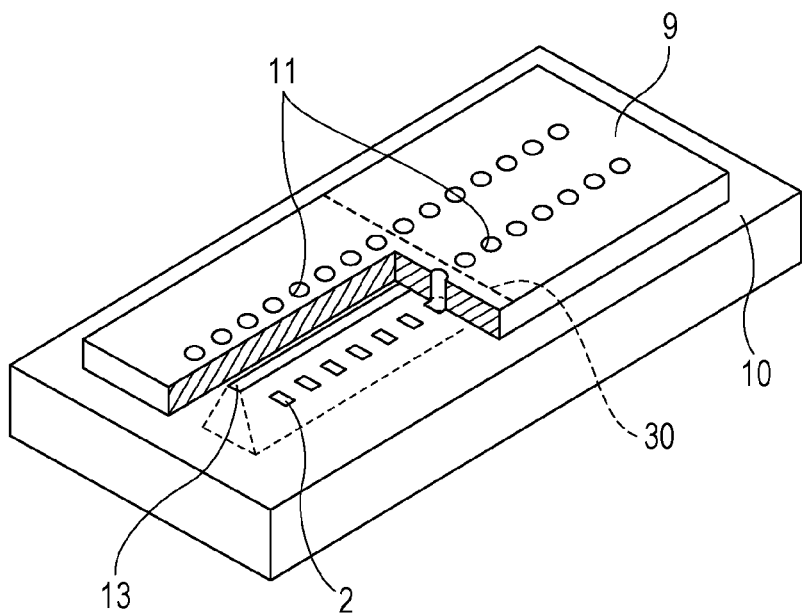
FIG. 1 is a schematic perspective view of a nozzle chip.

FIG. 1 is a schematic perspective view of a nozzle chip according to an embodiment disclosed herein. The nozzle chip according to the present embodiment includes an element substrate 10 on which energy generating elements 2 are arranged at a predetermined pitch in two rows. The energy generating elements 2 generate energy for ejecting liquid. A liquid supply port 13, which has been formed in the element substrate 10 by anisotropic etching, has an opening between the two rows of the energy generating elements 2. An ejection orifice forming member 9 is disposed on the element substrate 10. Ejection orifices 11, which correspond to the energy generating elements 2, and liquid flow paths (not shown), through which the ejection orifices 11 are connected to the liquid supply port 13, are formed in the ejection orifice forming member 9.

The ejection orifice forming member 9 also serves to form a portion, such as a top wall, of a flow path. Therefore, high mechanical strength as a structural material, adhesion to a base member, ink resistance, and a property that enables high-resolution patterning for forming fine patterns of ejection orifices are required for the ejection orifice forming member 9. Examples a material having such properties include a cationic polymerized epoxy resin composition. An epoxy resin is produced by, for example, a reaction between bisphenol A and epichlorohydrin, a reaction between bromo bisphenol A and epichlorohydrin, or a reaction between phenol novolac or o-cresol novolac and epichlorohydrin. Preferably, the epoxy equivalent of the epoxy resin be 2000 or less, and more preferably 1000 or less. If the epoxy equivalent is greater than 2000, the crosslink density decreases during a curing reaction, and adhesion and ink resistance are degraded.

Examples of a photocation polymerization initiator for curing an epoxy resin include a chemical compound that generates an acid when irradiated with light. An aromatic sulfonium salt and an aromatic iodonium salt are examples of such a compound. As necessary, a wavelength sensitizer may be added. Examples of a wavelength sensitizer include "SP-100", which is marketed by ADEKA Corporation.

The nozzle chip illustrated in FIG. 1 is disposed so that a surface in which the ejection orifices 11 are formed faces a recording surface of a recording medium. The energy generating elements 2 apply energy to a liquid (ink), which is supplied to the flow paths through the liquid supply port 13, and thereby droplets of the liquid are ejected from the ejection orifices 11. Recording is performed by making the droplets to adhere to the recording medium.

Referring back to FIG. 2, the exposure apparatus will be described further. Irradiation with light rays (exposure) is performed by using i-line light emitted from a light source that is, for example, a high-pressure mercury lamp. Light rays used for exposure are not limited to these, and any light rays having a wavelength to which a member subjected to patterning is photosensitive may be used.

When exposure to light is performed, a light ray may become inclined with respect to the optical axis of the optical system. Occurrence of an inclination of the chief ray with respect to the optical axis of the optical system is called the occurrence of "telecentricity". The degree of the inclination is called "off-axis telecentricity". In particular, with a reduction projection optical system, when the focus position deviates from the best focus position to a defocus position, distortion may occur (defocus distortion). In accordance with defocusing, the degree of distortion, that is, off-axis telecentricity changes.

The absolute value of off-axis telecentricity tends to be larger for light rays 261 in outer parts of a light beam than for a light ray 25 at the center of the light beam. The term "the center of the light beam" refers to the barycenter of a cross section of a light beam taken along a plane parallel to the mask. If the center of the light beam and the center of the mask are the same (on the same axis), the absolute value of off-axis telecentricity is larger for the light rays 261, which pass through an area near the edge of the mask than for the light ray 25, which passes through the center of the mask. The same relationship applies to the light rays and a lens, because the center of the mask is basically the same as the center of the lens. Due to the influence of off-axis telecentricity, a light ray emitted from the light source toward the mask has an inclination with respect to a direction perpendicular to a surface of the nozzle chip. When the inclination angle of a light ray is $\phi$, change in imaging position due to distortion caused by defocusing of 1 μm is 1000×tan $\phi$ (nm).

For an ordinary nozzle chip, the change in the imaging position is on the order of nanometers and the inclination angle $\phi$ is very small, so that tan $\phi \approx$ sin $\phi$.

Figure 3A:
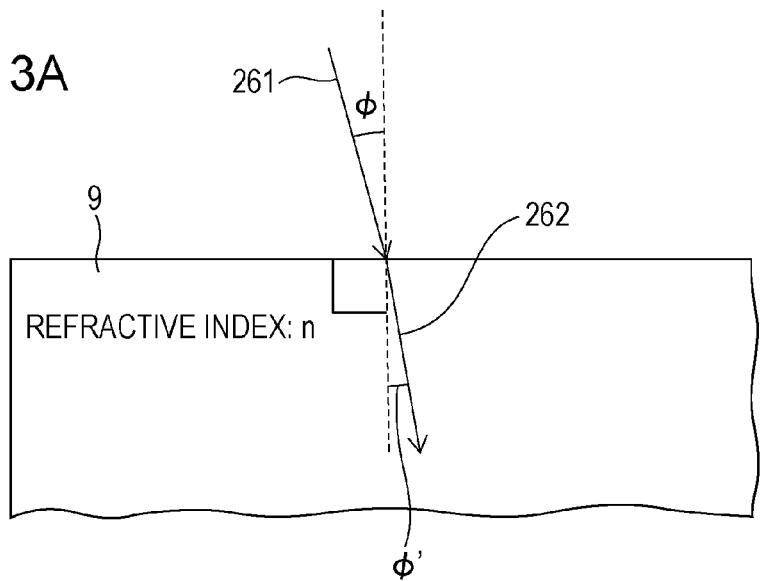
FIG. 3A is a schematic sectional view illustrating an inclination of a light beam in the exposure process using the reduction projection method.

When the light ray 261 having an inclination angle $\phi$ is incident on the ejection orifice forming member 9 on the element substrate as illustrated in FIG. 3A, an ejection orifice formed by patterning has an inclination angle $\phi' \approx \phi/n$, where n is the refractive index of a photosensitive resin of the ejection orifice forming member and where the refractive index of air is 1.

Figure 3B:
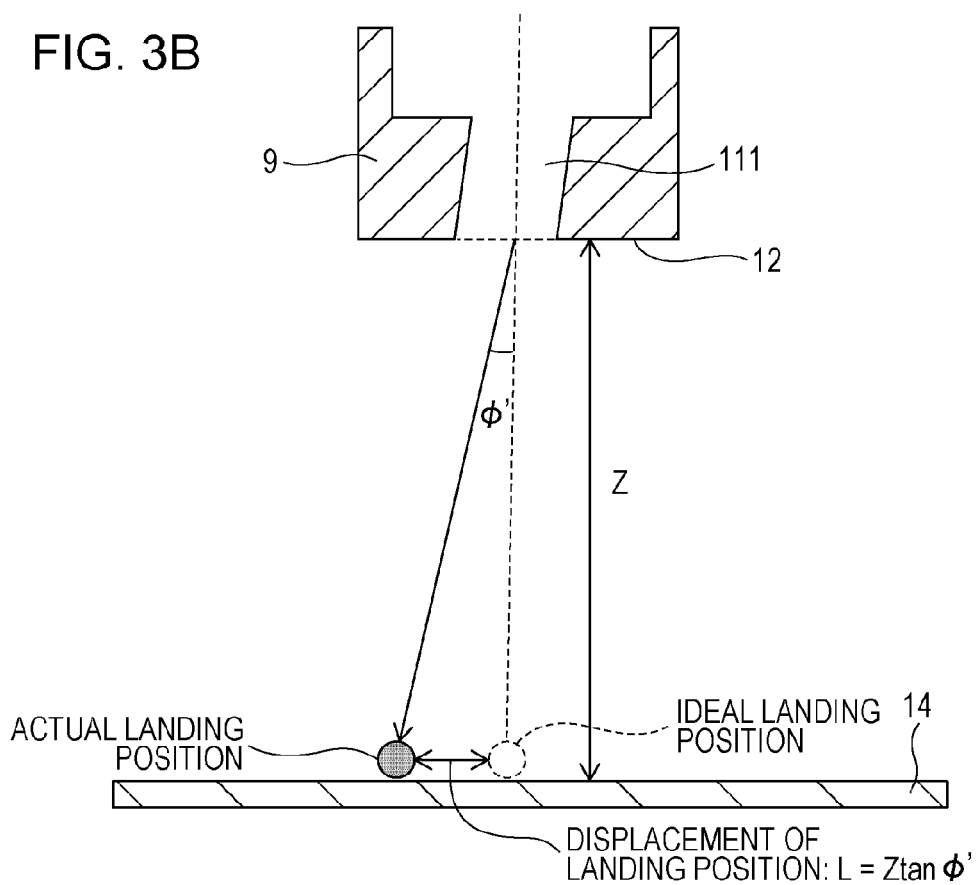
FIG. 3B is a schematic sectional view illustrating an inclination of a light beam in the exposure process using the reduction projection method.

As illustrated in FIG. 3B, a droplet is ejected from an ejection orifice 111, which has been formed by a light ray 262 having the inclination angle $\phi'$, with the inclination angle $\phi'$ of the ejection orifice with respect to a direction perpendicular to an ejection surface 12. Therefore, the droplet lands on a recording medium 14 at a position displaced from an ideal landing position. The displacement L=Z tan $\phi'$, where Z is the distance from the ejection surface 12 to the recording medium 14.

Figure 4:
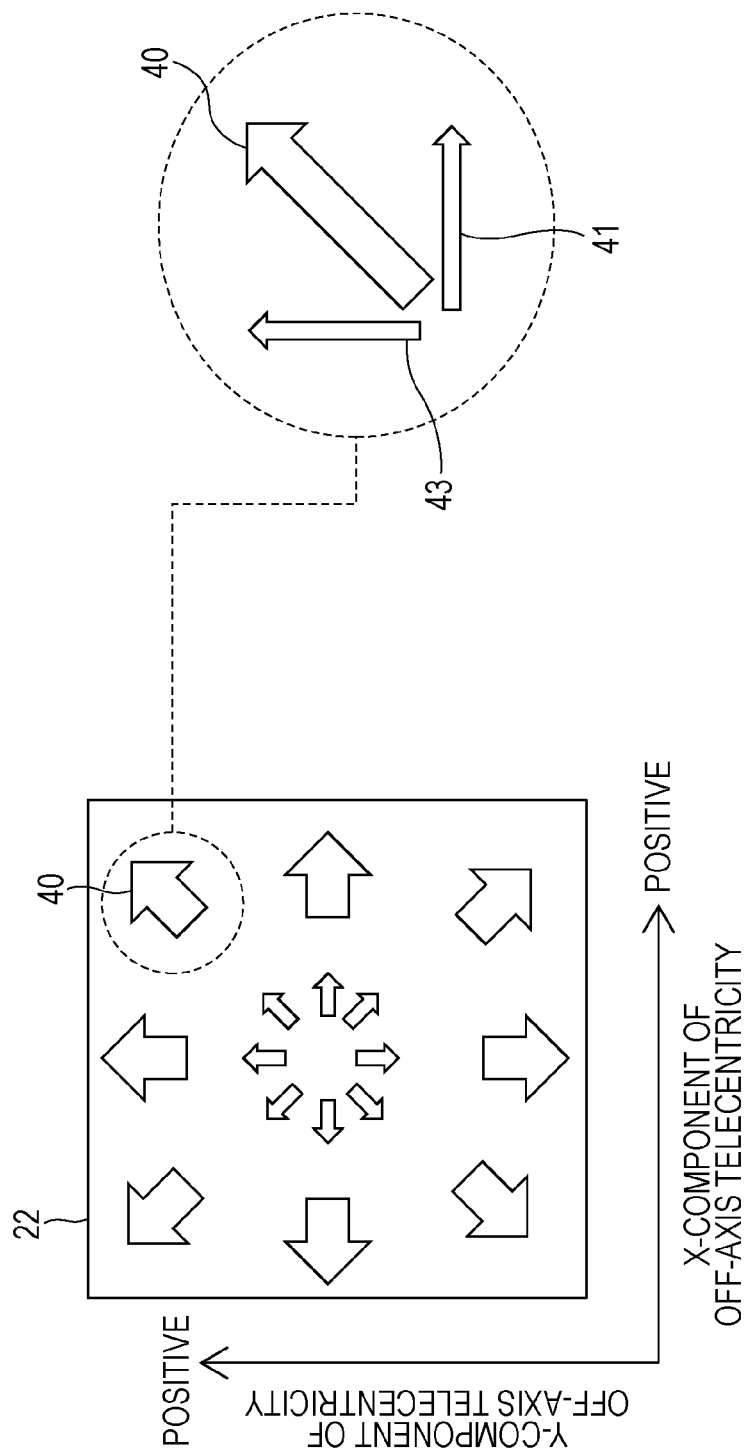
FIG. 4 is a conceptual diagram illustrating off-axis telecentricity that occurs on a mask.

FIG. 4 is a conceptual diagram illustrating off-axis telecentricity 40 that occurs on the mask 22. As described above, the larger the distance from the center of the mask, that is, the center of the light beam, the larger the absolute value of off-axis telecentricity becomes. Regarding the present invention, the directional components and the sign of off-axis telecentricity are defined as illustrated in FIG. 4.

With the exposure apparatus described here, off-axis telecentricity occurs in a direction away from the center of the mask. However, with some other exposure apparatuses, off-axis telecentricity occurs in a direction toward the center of the mask. The direction depends on the exposure apparatus. The present invention can be applied to exposure apparatuses of any of these types.

Figure 6A:
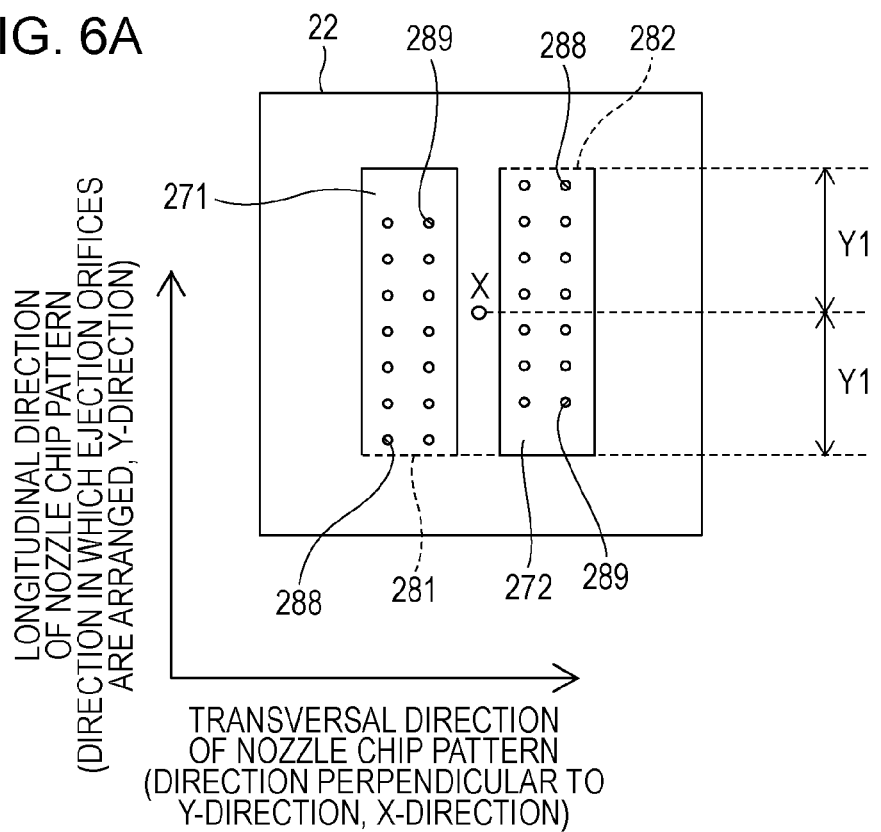
FIG. 6A is a schematic top view illustrating an ejection orifice row pattern of a nozzle chip on a mask.
Figure 6B:
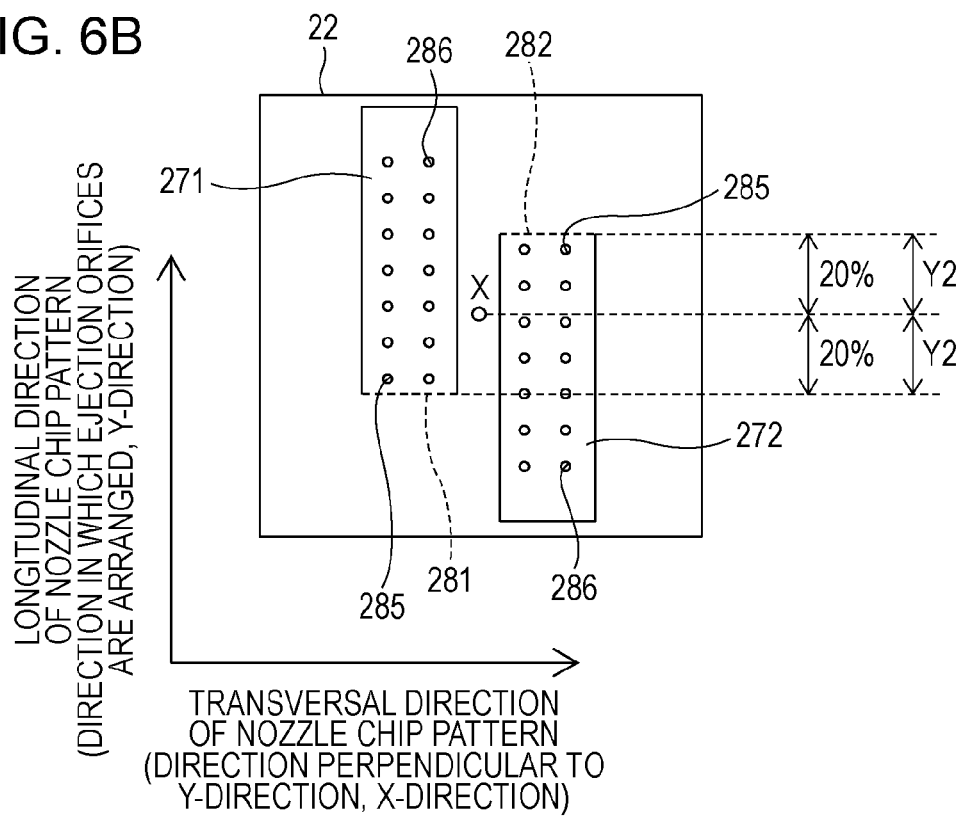
FIG. 6B is a schematic top view illustrating an ejection orifice row pattern of a nozzle chip on a mask.

The Y-direction of off-axis telecentricity is the same as the longitudinal direction of a nozzle chip pattern, that is, the direction in which ejection orifices are arranged (see FIGS. 6A, 6B, and 6C). The X-direction is a direction perpendicular to the Y-direction. The off-axis telecentricity 40 has an X-component 41 and a Y-component 43.

First Embodiment

Figure 5:
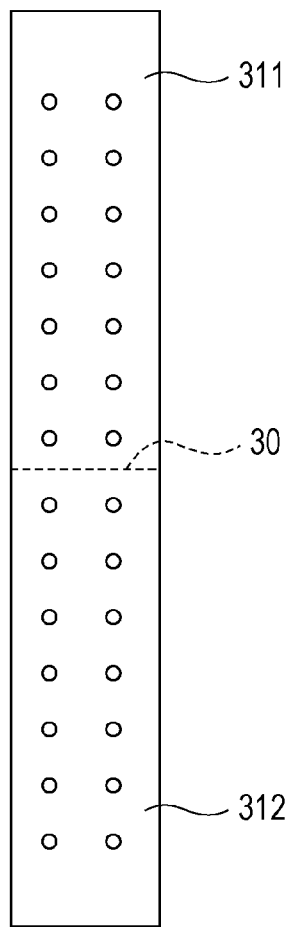
FIG. 5 is a schematic top view of a nozzle chip.

FIG. 5 is a schematic top view of one nozzle chip. When exposing one nozzle chip to light by a fractionated exposure method with which one nozzle chip is divided into two nozzle groups 311 and 312, a connection portion 30 is formed at a boundary surface between the divided nozzle groups. Fractionated exposure is a method of performing exposure to light a plurality of times so as to connect the connection portion.

FIG. 6A illustrates an example in which one nozzle chip is exposed to light by a fractionated exposure method using a mask to which the present disclosure has not been applied, and FIG. 6B illustrates an example in which one nozzle chip is exposed to light by a fractionated exposure method using a mask to which the present invention has been applied. With the present embodiment, the centers of a light beam, a mask, and a lens are on the same axis.

As illustrated in FIG. 6B, the mask has ejection orifice row patterns 271 and 272 that form an ejection orifice row pattern of one nozzle chip when they are connected to each other through connection portions 281 and 282. That is, the ejection orifice row pattern of one nozzle chip is divided into the ejection orifice row patterns 271 and 272. Referring to FIG. 6B, |Tab| denotes the absolute value of off-axis telecentricity, in the direction in which the ejection orifices of the ejection orifice row are arranged, that occurs in a light ray with which an ejection orifice 285 that is at the smallest distance from the connection portion 281 is irradiated, with respect to the direction in which the ejection orifices are arranged. Likewise, |Tat| denotes the absolute value of off-axis telecentricity, in the direction in which the ejection orifices are arranged, that occurs in a light ray with which an ejection orifice 286 that is at the largest distance from the connection portion 281 is irradiated. The present invention is characterized in that a relationship |Tat|>|Tab| is satisfied.

Referring to FIG. 6B, |Tbb| denotes the absolute value of off-axis telecentricity, in the direction in which the ejection orifices are arranged, that occurs in a light ray with which the ejection orifice 285 that is at the smallest distance from the connection portion 282 is irradiated, with respect to the direction in which the ejection orifices of the ejection orifice row are arranged. Likewise, |Tbt| denotes the absolute value of off-axis telecentricity, in the direction in which the ejection orifices are arranged, that occurs in a light ray with which the ejection orifice 286 that is at the largest distance from the connection portion 282 is irradiated. The present invention is characterized in that a relationship |Tbt|>|Tbb| is satisfied.

That is, with the present disclosure, chip patterns of a mask are disposed, with respect to the direction in which the ejection orifices are arranged, so that the absolute value of off-axis telecentricity of a light ray with which an ejection orifice that is at the smallest distance from the connection portion is irradiated is smaller than the absolute value of off-axis telecentricity of a light ray with which an ejection orifice that is at the largest distance the connection portion is irradiated. Here, the relationship with the center of the mask 22 is the same as described above, because the center of the light beam and the center of the mask 22 are on the same axis. For ejection orifices that are at the same distance from the connection portion, the condition may be determined about one of such ejection orifices. When the ejection orifice forming member is made of a negative photosensitive resin, a portion in which an ejection orifice is to be formed is masked so as not to be exposed to light. In this case, because a portion that forms an outer periphery of an ejection orifice is exposed to light, off-axis telecentricity is defined for a light ray with which an outer peripheral portion of the ejection orifice is irradiated.

It is preferable that the absolute value of the difference between the off-axis telecentricities Tab and Tbb, that is, |Tab−Tbb| be as small as possible. The smaller the value of |Tab−Tbb|, the more effectively displacement of the landing positions of droplets ejected from ejection orifices that are disposed adjacent to each other with the connection portion therebetween is reduced. To be specific, it is preferable that the connection portion be disposed at a position that is within 20% from the center of the mask in the Y-direction. In FIG. 6B, Y2 denotes a range within 20% from the center X of the mask. Thus, the influence of the connection portion on off-axis telecentricity is reduced, and thereby lines generated at the connection portion when printing is performed can be reduced. The position of the connection portion in the Y-direction may be the same as that of the center of the mask.

Heretofore, it has been assumed that the connection portion is a line, that is, the connection portion does not have a width. However, the connection portion may have a width. That is, at such a connection portion, irradiation with light rays is performed a plurality of times. In this case, the distance between the connection portion and each ejection orifice is defined as the distance from the ejection orifice to a part of the connection portion that is at the smallest distance from the ejection orifice.

In FIG. 6A, with respect to the direction in which the ejection orifices of the ejection orifice row are arranged, the absolute value of off-axis telecentricity, in the direction in which the ejection orifices are arranged, that occurs in a light ray with which an ejection orifice 288 that is at the smallest distance from the connection portion 281 is irradiated is larger than the absolute value of off-axis telecentricity, in the direction in which the ejection orifices are arranged, that occurs in a light ray with which an ejection orifice 289 that is at the largest distance from the connection portion 281 is irradiated. This is because the distance from the center of the mask 22 to the ejection orifice 288, which is at the smallest distance from the connection portion 281, is larger than the distance from the center of the mask 22 to the ejection orifice 289, which is at the largest distance from the connection portion 281. The distance Y1 from the center of the mask X to the connection portion in the direction in which the ejection orifices are arranged is large.

Off-axis telecentricity may be calculated for a light ray with which a specific area of a mask is irradiated, and the off-axis telecentricity for any position on the mask may not be obtained. For example, the off-axis telecentricities for intersection points of 9×9 equidistant grid on a mask are obtained. For this reason, depending on the disposition of the mask or the shape of a chip pattern, it may not be possible to calculate the off-axis telecentricity of a light ray with which an ejection orifice that is at the smallest distance from the connection portion is irradiated. In this case, the telecentricity of the entire mask or the telecentricity of a part of the mask is plotted in a coordinate plane on the mask, and a value obtained by curve fitting is used as the off-axis telecentricity.

As disclosed, divided chip patterns may be disposed on a mask so that one nozzle chip is exposed to light. Alternatively, divided chip patterns may be arranged in the transversal direction (X-direction) of a chip pattern, so that a plurality of divided chip patterns can be exposed to light simultaneously.

Figure 7A:
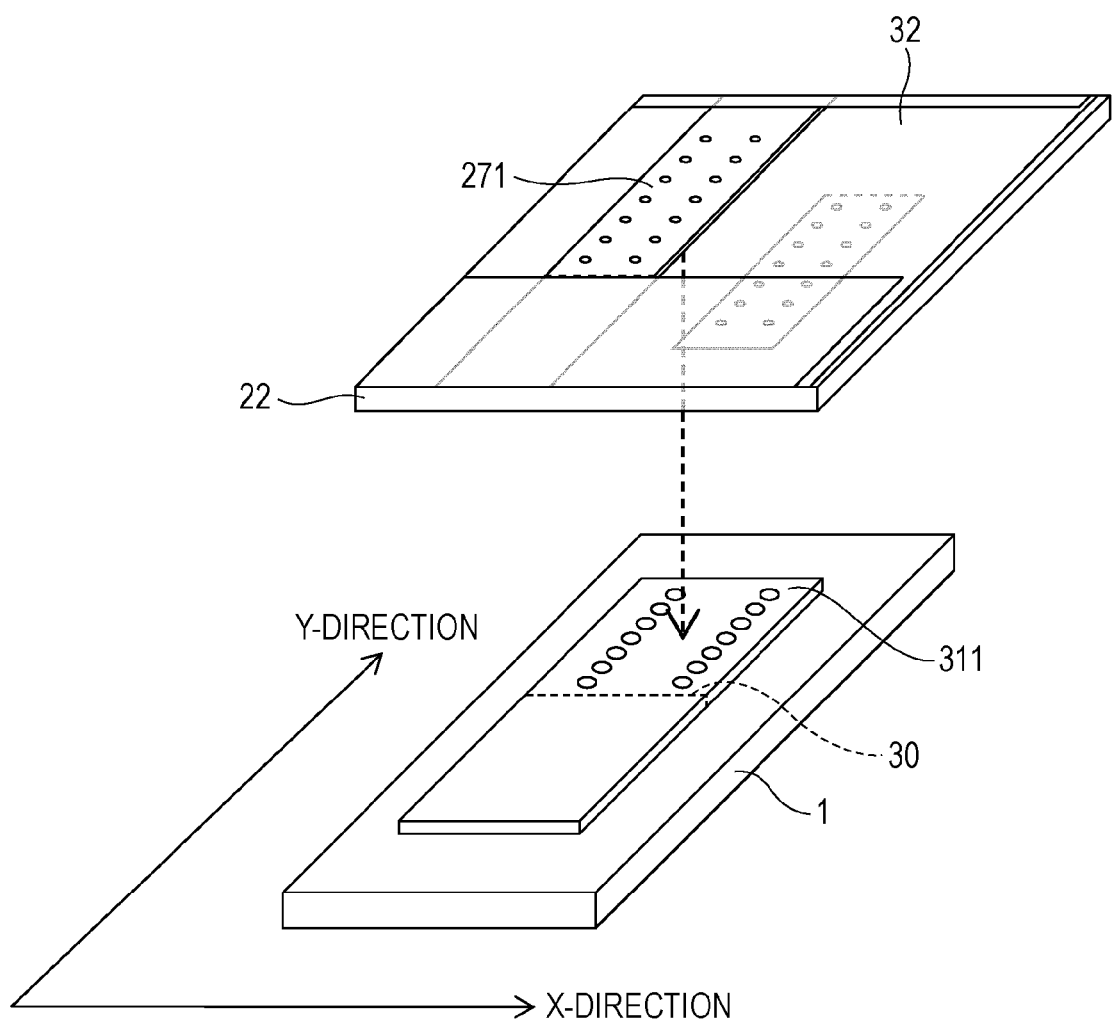
FIG. 7A is a schematic perspective view illustrating a process of patterning a nozzle chip.
Figure 7B:
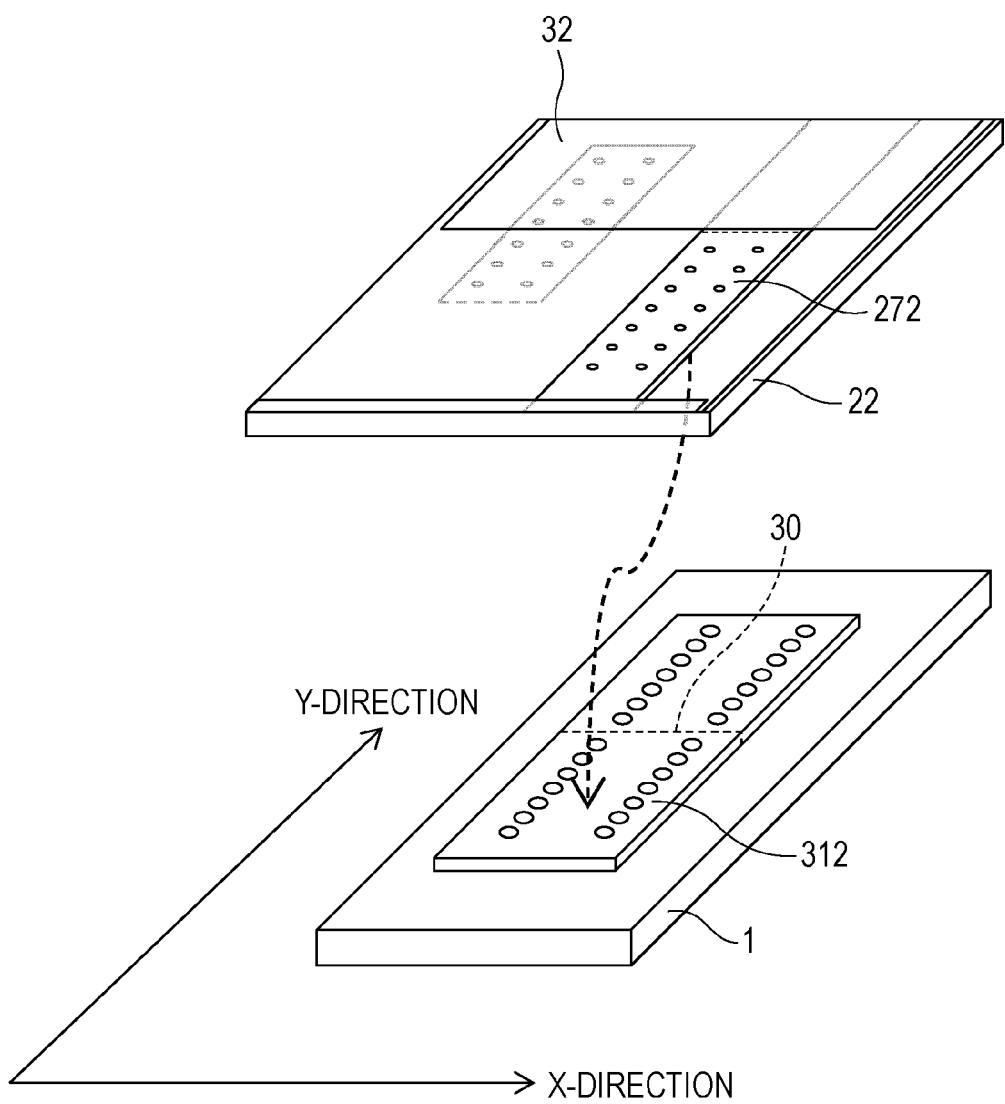
FIG. 7B is a schematic perspective view illustrating the process of patterning a nozzle chip.

FIGS. 7A and 7B are schematic perspective views illustrating a process of patterning a nozzle chip by irradiating the nozzle chip with a light ray by using a mask to which the present disclosure has been applied. First, as illustrated in FIG. 7A, a first exposure is performed while blocking parts of the mask other than the ejection orifice row pattern 271 with a light-shielding member 32 so as to form the nozzle group 311 by transferring the ejection orifice row pattern 271 onto an ejection orifice forming member. Next, as illustrated in FIG. 7B, a second exposure is performed while blocking parts of the mask other than the ejection orifice row pattern 272 with the light-shielding member 32 so as to form the nozzle group 312 by transferring the ejection orifice row pattern 272 onto the ejection orifice forming member.

In the example illustrated in FIGS. 7A and 7B, exposure is performed in the order of the ejection orifice row patterns 271 and 272. However, the order of exposure may be appropriately changed. The fractionated chip patterns are disposed on the same mask so as to increase the throughput. However, the fractionated chip patterns may be independently disposed on different masks.

Figure 8B:
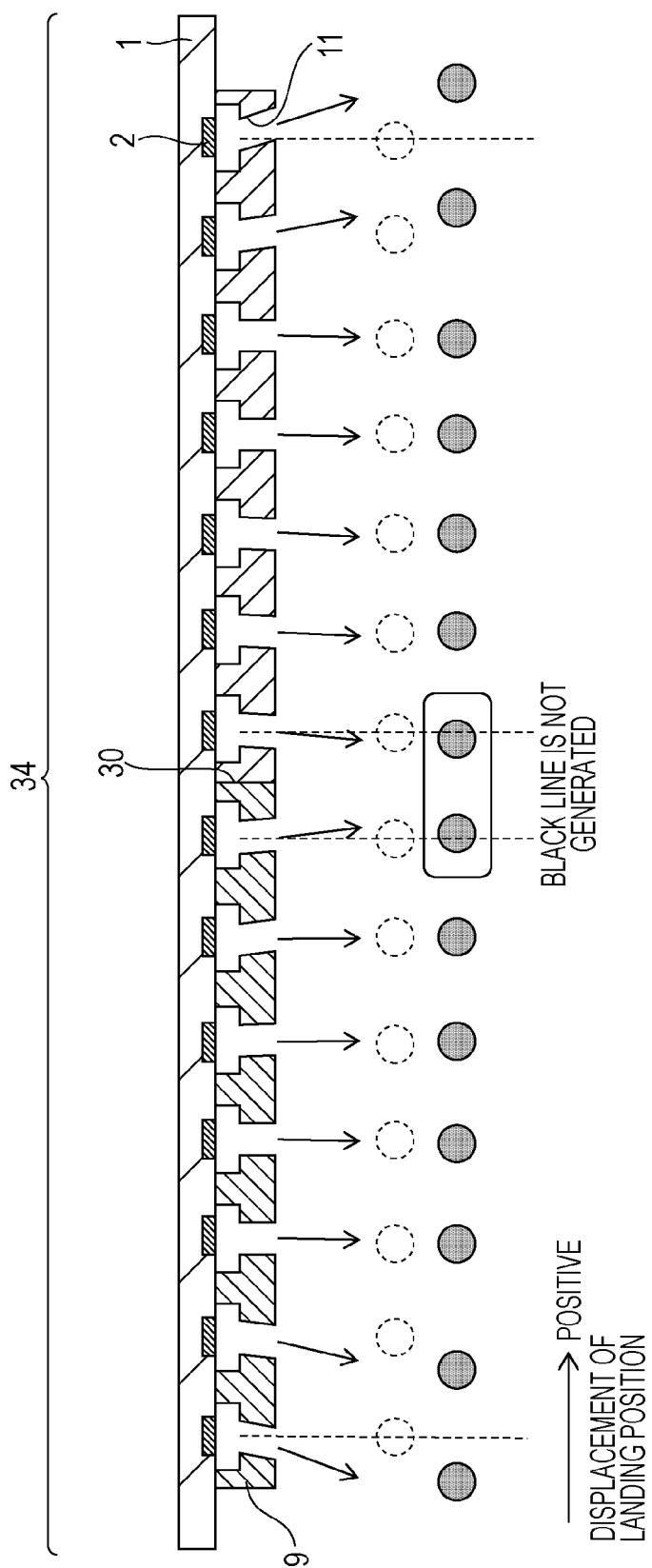
FIG. 8B is a schematic sectional view related to ejection from a nozzle chip.

FIG. 8A includes a schematic sectional view of a nozzle chip 33 made by using a mask to which the present disclosure has not been applied and a schematic view illustrating ejection and displacement of the landing positions. FIG. 8B includes a schematic sectional view of a nozzle chip 34 that is made by using a mask to which the present disclosure is applied and a schematic view illustrating ejection and displacement of the landing positions. When the focus position deviates from the best focus position to a defocus position, a light ray is inclined toward the center of the mask in a direction perpendicular to a nozzle chip surface. Because the light ray is incident on the ejection orifice forming member from air, the inclination angle is further changed due to the refractive index of the ejection orifice forming member. The ejection orifice forming member is generally made of a photosensitive resin that is an organic compound, so that the refractive index of the ejection orifice forming member is usually larger than 1, which is the refractive index of air.

In FIGS. 8A, 8B, and 8C, the ejection orifices of the nozzle chip are inclined outward in the longitudinal direction of the chip. Therefore, droplets are ejected in directions inclined outward from the chip at small angles, so that the droplets ejected from the ejection orifices that are located adjacent to each other with the connection portion therebetween form dots at positions adjacent to each other on a recording medium. As a result, a line (black line) is generated on the recording medium.

With some exposure apparatuses, light rays may be inclined toward the outer periphery of the mask due to occurrence of off-axis telecentricity. In this case, ejection orifices that are located adjacent to each other with the connection portion therebetween form dots at positions away from each other, so that a line (white line) is generated on a recording medium.

By performing transport control of a recording medium or the like, displacements of landing positions of droplets ejected from ejection orifices at both ends of the nozzle chip can be more easily corrected than those of droplets ejected from ejection orifices in a middle part of the nozzle chip. Therefore, displacements of landing positions of droplets ejected from ejection orifices at both ends of the nozzle chip are not a big problem. However, as illustrated in FIG. 8B, when the present disclosure is applied, displacements of landing positions of droplets ejected from ejection orifices at both ends of the chip may increase. Therefore, with consideration of the displacements of landing positions of droplets ejected from ejection orifices at both ends of the chip, it is preferable that the positions of ejection orifices corresponding to the energy generating elements at both ends of the chip be shifted so as to correct the displacements of the landing positions.

As illustrated in FIG. 8C, the accuracy of ejection can be further increased as compared the structure illustrated FIG. 8B. FIG. 8C illustrates a nozzle chip 35 in which ejection orifices in a region surrounding the connection portion are formed at positions displaced toward ends of the nozzle. That is, with respect to the direction in which the ejection orifices are arranged, the distance between each of ejection orifices that are at the smallest distance from the connection portion and an adjacent ejection orifice is smaller than the distance between each of ejection orifices that are at the largest distance from the connection portion and an adjacent ejection orifice. With such a structure, the accuracy of ejection can be further increased.

Figure 9A:
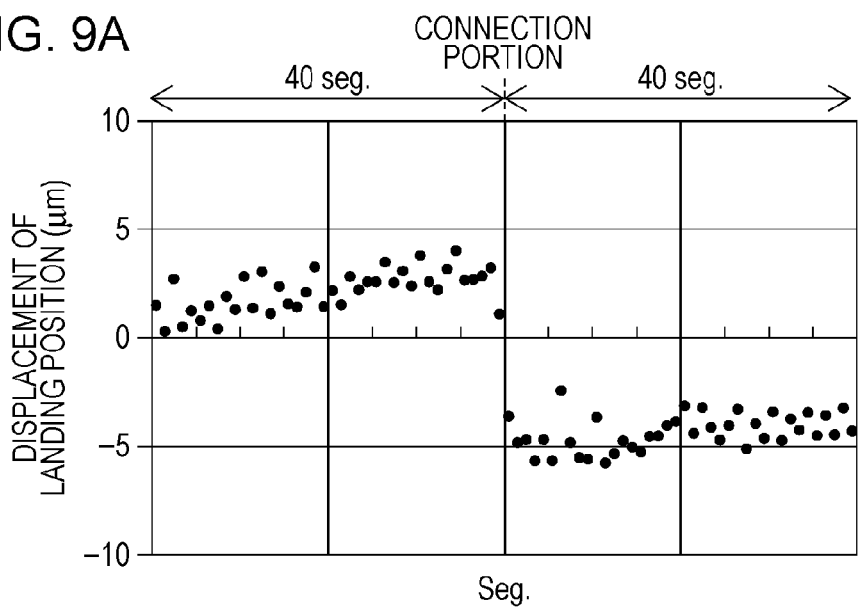
FIG. 9A is a graph representing displacements of landing positions of ejected droplets from ideal landing positions.
Figure 9B:
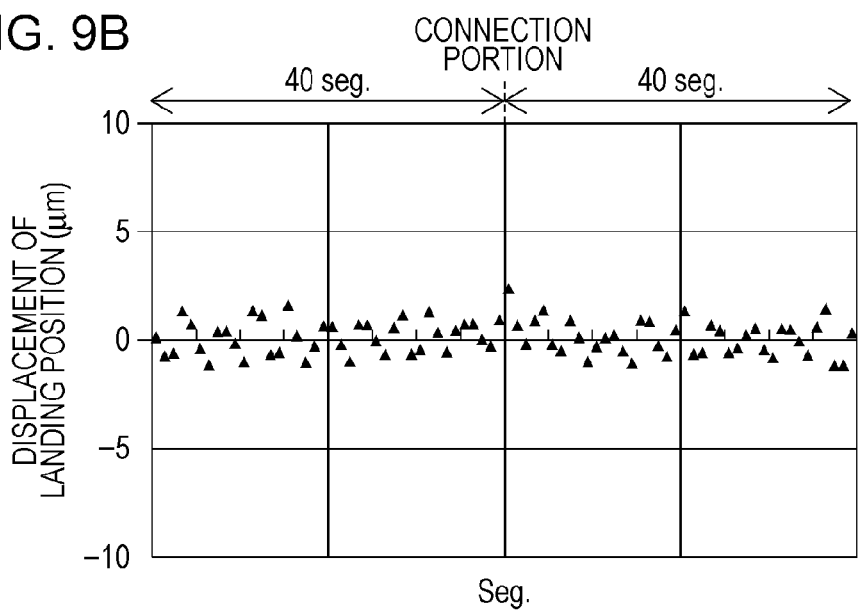
FIG. 9B is a graph representing displacements of landing positions of ejected droplets from ideal landing positions.

FIG. 9A is a graph representing displacements of landing positions, in the direction in which the ejection orifices are arranged (Y-direction), of droplets ejected from the first to fortieth ejection orifices from a position nearest to the connection portion of a nozzle chip that has been made by using a mask to which the present invention has not been applied. FIG. 9B is a graph representing displacements of landing positions, in the direction in which the ejection orifices are arranged (Y-direction), of droplets ejected from the first to fortieth ejection orifices from the connection portion of a nozzle chip that has been made by using a mask to which the present invention has been applied. The signs of displacements of the landing positions are defined the same as that of FIGS. 8A, 8B, and 8C.

In FIG. 9A, the landing positions are displaced with the connection portion therebetween. When an image was formed in this state, image dots were formed close to each other, a black line was generated, and print quality decreased. In contrast, in FIG. 9B, displacements of landing positions of droplets ejected from ejection orifices near the connection portion were clearly reduced. When an image was formed, a black line was not generated, and the print quality was good.

Second Embodiment

In the present disclosure, an ejection orifice row pattern of one nozzle chip on a mask may be divided into three or more patterns. In this case, an ejection orifice row pattern having a size that is not within the field angle when the pattern is divided into two patterns can be appropriately subjected to patterning.

In the present embodiment, as illustrated in FIG. 6C, an ejection orifice row pattern of one nozzle chip on a mask may be divided into three patterns. When the pattern is divided into three or more patterns, at least one ejection orifice row pattern, which is an ejection orifice row pattern 273 in this case, has connection portions (283, 284) at both ends thereof in the direction in which the ejection orifices are arranged. The ejection orifice row patterns 271 and 272 have a relationship the same as that of the first embodiment. As with the first embodiment, for the disposition of the ejection orifice row pattern 273, it is preferable that |Tab−Tc1|, which is the absolute value of the difference between off-axis telecentricities Tab and Tc1 occurring in the connection portions 281 and 283, be as small a possible. Likewise, it is preferable that |Tbb−Tc2|, which is the absolute value of the difference between off-axis telecentricities Tbb and Tc2 occurring in connection portions 282 and 284, be as small a possible.

A patterning image according to the second embodiment is illustrated in the right-hand part of FIG. 6C. Regarding other making steps, the method of making a nozzle chip is the same as that of the first embodiment.

With a nozzle chip made by using a method according to the second embodiment, a good image was formed while preventing generation of a line.

With the present disclosure, even with a nozzle chip made by using a method using fractionated exposure, displacement of landing positions of droplets of a liquid ejected from ejection orifices in the vicinity of a connection portion of the fractionated exposure can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2011/078748, filed Dec. 13, 2011, which is hereby incorporated by reference herein in its entirety.

Industrial Applicability

The present embodiments can also be used as a method of making nozzle chips.

The invention claimed is:

1. A method of making a nozzle chip comprising a step of forming an ejection orifice row by performing irradiation with light rays using a mask having ejection orifice row patterns that form an ejection orifice row pattern of one nozzle chip when the ejection orifice row patterns are connected to each other through a connection portion, wherein the mask is configured such that, with respect to a direction in which ejection orifices of the ejection orifice row are arranged, an absolute value of off-axis telecentricity of one of the light rays with which an ejection orifice that is at the smallest distance from the connection portion is irradiated is less than an absolute value of off-axis telecentricity of one of the light rays with which an ejection orifice that is at the greatest distance from the connection portion is irradiated.

2. The method of making a nozzle chip according to claim 1, wherein the ejection orifice row pattern of the mask is an ejection orifice row pattern configured such that, with respect to the direction in which the ejection orifices of the ejection orifice row are arranged, a distance from a center of a light beam with which the mask is irradiated to the ejection orifice that is at the smallest distance from the connection portion is less than a distance from the center of the light beam to the ejection orifice that is at the greatest distance from the connection portion.

3. The method of making a nozzle chip according to claim 1, wherein the irradiation of the light rays is performed by a reduction projection optical system.

* * * * *